(12) United States Patent
Zarkesh-Ha et al.

(10) Patent No.: US 9,997,644 B2
(45) Date of Patent: Jun. 12, 2018

(54) CONTROL CIRCUITS FOR DYNAMICALLY BIASED AVALANCHE PHOTODIODES

(71) Applicant: Dynamic Photonics, Inc., Albuquerque, NM (US)

(72) Inventors: Payman Zarkesh-Ha, Albuquerque, NM (US); Majeed M. Hayat, Albuquerque, NM (US); Robert Efroymson, Santa Fe, NM (US)

(73) Assignee: DYNAMIC PHOTONICS, INC., Albuquerque, NM (US)

( * ) Notice: Subject to any disclaimer, the term of this patent is extended or adjusted under 35 U.S.C. 154(b) by 264 days.

(21) Appl. No.: 15/081,729

(22) Filed: Mar. 25, 2016

(65) Prior Publication Data

US 2016/0284878 A1 Sep. 29, 2016

Related U.S. Application Data

(60) Provisional application No. 62/138,183, filed on Mar. 25, 2015.

(51) Int. Cl.
| | |
|---|---|
| *H01L 31/107* | (2006.01) |
| *H01L 31/02* | (2006.01) |
| *H01L 31/0304* | (2006.01) |

(52) U.S. Cl.
CPC .... *H01L 31/02027* (2013.01); *H01L 31/0304* (2013.01); *H01L 31/107* (2013.01); *Y02E 10/544* (2013.01)

(58) Field of Classification Search
CPC ........... H01L 31/02027; H01L 31/0304; H01L 31/107; H04B 10/6911; Y02E 10/544

USPC .................................. 250/214.1, 214 R
See application file for complete search history.

(56) References Cited

U.S. PATENT DOCUMENTS 3,644,740 A * 2/1972 Dobratz .................... G01J 1/44
250/214 R

OTHER PUBLICATIONS

El-Howayek, et al., "Error Probabilities for Optical Receivers That Employ Dynamically Biased Avalanche Photodiodes", IEEE Transactions on Communications, vol. 63, No. 9, 2015, 3325-3335.
El-Howayek, et al., "Method for Performance Analysis and Optimization of APD Optical Receivers Operating Under Dynamic Reverse Bias", 2013 IEEE Photonics Conference, 2013, 362-363.
El-Howayek, et al., "On the Use of Gaussian Approximation in Analyzing the Performance of Optical Receivers", IEEE Photonics Journal, vol. 6, No. 1, 2014, 1-8.

(Continued)

*Primary Examiner* — Que T Le
(74) *Attorney, Agent, or Firm* — Peacock Law P.C.; Philip Askenazy; Deborah Peacock

(57) ABSTRACT

Method and apparatus for maximizing the output of a dynamically biased avalanche photodiode (APD). The output of the APD is amplified. A feedback loop comprising a phase shifter measures the RF power of the amplified output and adjusts the phase of the AC signal which is used to dynamically bias the APD until the output power is maximized. The AC signal is also split into out of phase signals, thereby substantially canceling out the bias current injected into the APD output, leaving only the desired amplified optical output signal. The monitoring and tuning of the AC dynamic bias can eliminate phase drift over time, as well as other non-ideal effects that can occur, such as those due to temperature changes or device aging effects.

19 Claims, 4 Drawing Sheets

(56) References Cited

OTHER PUBLICATIONS

Hayat, et al., "Breaking the buildup-time limit of sensitivity in avalanche photodiodes by dynamic biasing", Optics Express, vol. 23, No. 18, 2015, 24035-24041.

Hayat, et al., "Multiplication theory for dynamically biased avalanche photodiodes: new limits for gain bandwidth product", Optics Express, vol. 20, No. 7, 2012, 8024-8040.

Ong, et al., "Optimization of InP APDs for High-Speed Lightwave Systems", Journal of Lightwave Technology, vol. 27, No. 15, 2009, 3294-3302.

* cited by examiner

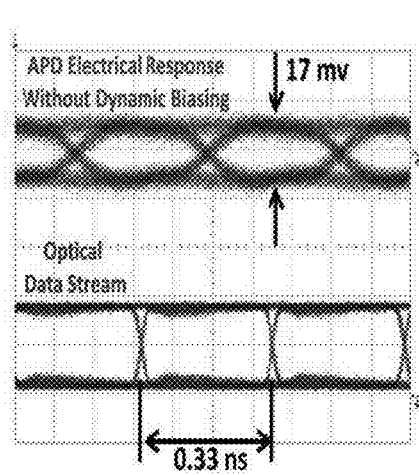
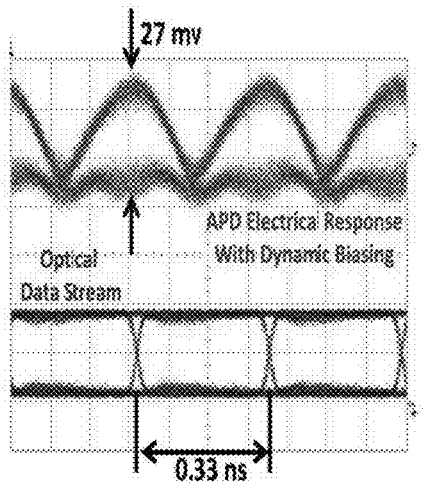
FIG. 6A
FIG. 6B
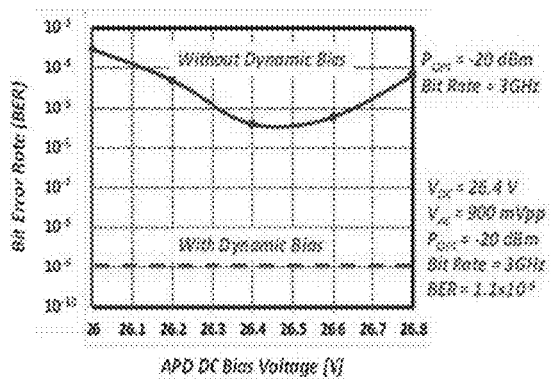
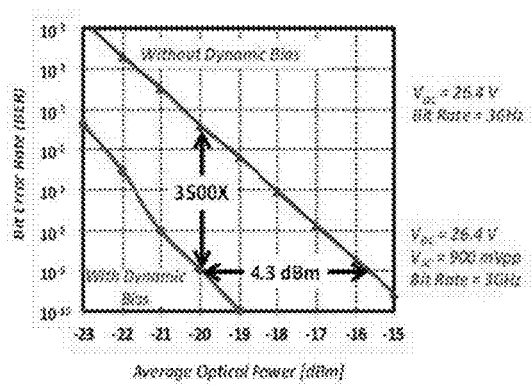
FIG. 7A
FIG. 7B

CONTROL CIRCUITS FOR DYNAMICALLY BIASED AVALANCHE PHOTODIODES

CROSS-REFERENCE TO RELATED APPLICATIONS

This application claims priority to and the benefit of filing of U.S. Provisional Patent Application Ser. No. 62/138,183, entitled "Control Circuits for Dynamically Biased Avalanche Photodiodes", filed on Mar. 25, 2015, the specification of which is incorporated herein by reference.

BACKGROUND OF THE INVENTION

Technical Field

Field of the Invention

The present invention relates to circuits and methods for the automatic control and tuning of the dynamic bias phase used for avalanche photodiodes without altering the incoming data.

Background of the Invention

Note that the following discussion may refer to a number of publications and references. Discussion of such publications herein is given for more complete background of the scientific principles and is not to be construed as an admission that such publications are prior art for patentability determination purposes.

Avalanche photodiodes (APDs) are the photodetectors of choice in high-speed direct-detection optical communication systems, particularly low cost optical receivers, due to their high sensitivity compared to PIN photodiodes and low-cost compared to receivers that employ PIN photodiodes in conjunction with optical pre-amplifiers. An APD provides high internal gains through a stochastic cascade of impact ionizations effected by a strong reverse bias, a feature that is not present in the simpler PIN photodetectors. However, the APD's internal gain comes at the cost of the avalanche-buildup time, the time it takes for the chain of all impact ionizations to terminate every time a photon-generated carrier triggers an avalanche of impact ionizations. The relatively long buildup time often limits the APD's gain-bandwidth product (GBP) and can lead to inter-symbol interference (ISI) when the APD is operated at gains of interest (>10) in high-speed optical receivers. Thus current APDs are not able to meet the requirements for high bit-rate telecom systems. Currently there are no commercially available telecommunications APDs that can operate at the rate of 40 gigabits per second (Gbps).

There have been numerous efforts in the past two decades to explore new materials, device concepts, and structures to overcome the buildup-time limitation of InP and InAlAs APDs for above-10 Gbps long/middle reach operation and for low-power applications. Key examples are waveguide APDs, in which a very thin absorption layer is used to reduce carrier-transit time. However, they suffer from the tradeoff between responsivity (which improves with the waveguide length) and speed (which decreases as the device capacitance increases with the waveguide length). In addition, they have very tight optical tolerance requirements due to the narrow waveguide. A vertical illumination InGaAs—InAlAs APD operating at 50 Gbps with a GBP of 270 GHz was reported; the operating gain at 35 GHz was achieved at low gain (~3) due to the buildup time, which translates to a sensitivity of −10.8 dBm. It has become clear that in order to break the GBP limit of APDs the buildup time must be substantially reduced. While Si—Ge APDs have shown promise in this direction, their overall effectiveness has not been demonstrated due to their low responsivity and high dark currents.

The dynamic biasing method has been shown to be a novel, robust, and device-agnostic solution that potentially improves the speed, sensitivity and GBP of APDs needed for 40 Gbps light-wave systems and beyond. Details can be found in U.S. patent application Ser. No. 13/289,645. One difficulty of implementing dynamic biasing APDs is their parasitic capacitance, which causes the dynamic-bias signal to be injected into the optical current generated by the APD (FIG. 1). At high frequencies the injected bias current, which is unwanted at the output signal, can be orders of magnitude larger than the optical current (signal), and overwhelms it completely. There are several techniques that have been suggested to address the current-injection problem in dynamically biased APDs. For any noise cancelling technique, a precise phase-tuning circuit is necessary to tune the dynamic bias phase without altering the effect of the incoming data, such that an optimum dynamic-bias-free photocurrent can be achieved. Currently there is no automatic phase-tuning circuit available that can address the state problem.

SUMMARY OF THE INVENTION

The present invention is a method of maximizing the output signal of a dynamically biased avalanche photodiode (APD), the method comprising dynamically biasing an APD; amplifying an output of the APD; measuring the amplified output; and automatically varying a phase of the AC signal used to dynamically bias the APD until a maximum of the amplified output is achieved. The amplifying step preferably comprises using a transimpedance amplifier. The measuring step preferably comprises measuring an RF power of the amplified output. The varying step is preferably performed substantially slower than a clock speed of the output signal. The method preferably further comprises splitting the AC signal into two split AC signals which are 180° out of phase with each other; and canceling out the AC signal, thereby removing it from the output of the APD. The splitting step is optionally performed using a differential amplifier or an RF power splitter. The canceling step is preferably performed using a dummy APD, varactor, or fixed capacitor matched to the capacitance of the APD. The method optionally further comprises filtering the amplified output to perform a function selected from the group consisting of performing temporal averaging of the output to remove high-frequency noise, eliminating, averaging out, and/or removing periodic components of the amplified output, and accentuating the correction of output components that affect phase mismatch of the two split AC signals. The filtering step is preferably performed prior to the measuring step. The method is preferably performed to correct for phase drift over time, temperature changes, and/or device aging effects.

The present invention is also an apparatus for maximizing the output signal of a dynamically biased avalanche photodiode (APD), the apparatus comprising a dynamically biased APD; an amplifier (preferably a transimpedance amplifier) for amplifying the output of the APD; an RF power detector connected to the output of the amplifier; and a phase shifter for adjusting the phase of an AC signal used to dynamically bias the APD until an output of the RF power detector is maximized. The apparatus optionally further comprises a differential amplifier or an RF power splitter having an input connected to the output of the phase shifter and two outputs 180° out of phase with each other, wherein the first output biases the APD and the second output biases a dummy APD, varactor, or fixed capacitor. For the RF power splitter, the first output preferably biases the APD through a fixed attenuator, and the second output preferably biases the dummy APD, varactor, or fixed capacitor through a tunable attenuator and a second phase shifter. The tunable attenuator and second phase shifter preferably use the output of the RF power detector as an input. The apparatus optionally further comprising a filter disposed between the amplifier and the RF power detector, the filter preferably comprising a low pass filter, a high pass filter, or a bandpass filter.

Objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention.

BRIEF DESCRIPTION OF THE DRAWINGS

The accompanying drawings, which are incorporated into and form a part of the specification, illustrate one or more embodiments of the present invention and, together with the description, serve to explain the principles of the invention. The drawings and the dimensions therein are only for the purpose of illustrating certain embodiments of the invention and are not to be construed as limiting the invention.
In the Drawings:

FIG. 6A is an experimental eye diagram, at 3 Gbps, for a static biasing scheme. The optical power at the APD is −16.7 dBm. The DC bias is −26.4 V.

FIG. 6B is an experimental eye diagram, at 3 Gbps, for a dynamic biasing scheme. The optical power at the APD is −16.7 dBm. The DC bias is −26.4 V, and the AC bias is 0.9 Vpp.

FIG. 7A shows the bit error rate (BER) of the static-bias APD as a function of the reverse bias. The dashed line represents the BER corresponding to the dynamic bias.

FIG. 7B shows the BER as a function of the optical power received by the APD for the dynamic- and static-bias cases.

DETAILED DESCRIPTION OF THE INVENTION

Figure 1:
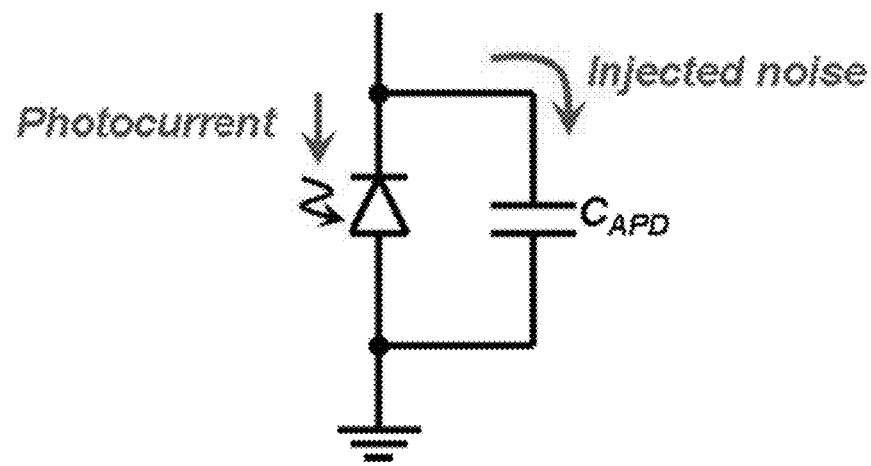
FIG. 1 shows injection noise due to parasitic capacitance in a standard dynamically biased APD.
Figure 2:
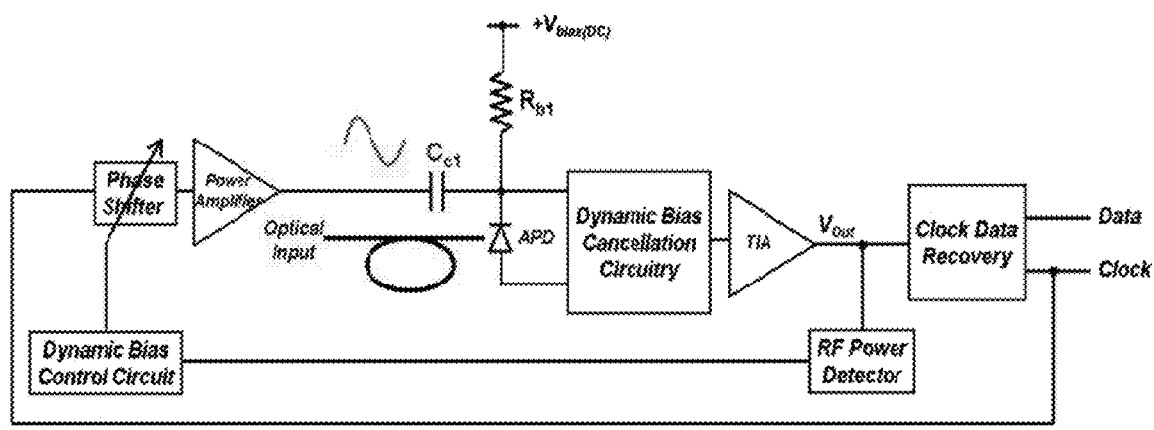
FIG. 2 is a schematic of an embodiment of a control circuit for a dynamically biased APD.

Embodiments of the present invention reduce or eliminate current injection in dynamically biased APDs, and also make the dynamic biasing approach robust in the face of environment changes of the circuit such as changes in temperature, aging of components, etc. Embodiments of the present invention preferably use a control/feedback signal obtained from the output to implement a phase-tuning circuit in order to yield the maximum signal strength. As shown in FIG. 2, a radio frequency (RF) power detector is preferably used to measure the RMS value of the RF signal generated by the trans-impedance amplifier (TIA) and use it to tune the phase of the dynamic bias in order to electronically optimize the RF output power. The dynamic bias control circuit adjusts the phase of the AC dynamic bias via the phase shifter while measuring the output from the RF power detector until it detects the maximum of the output power. Since the dynamics of PLL inside the clock-data recovery circuit are involved, and in order to guarantee a stable feedback loop, using a slower tuning process for the dynamic dynamic-bias control circuit is preferable. This continuous monitoring and tuning capability of the AC dynamic bias preferably eliminates phase drift over time, as well as other non-ideal effects that can occur, such as those due to temperature changes or device aging effects.

Figure 3A:
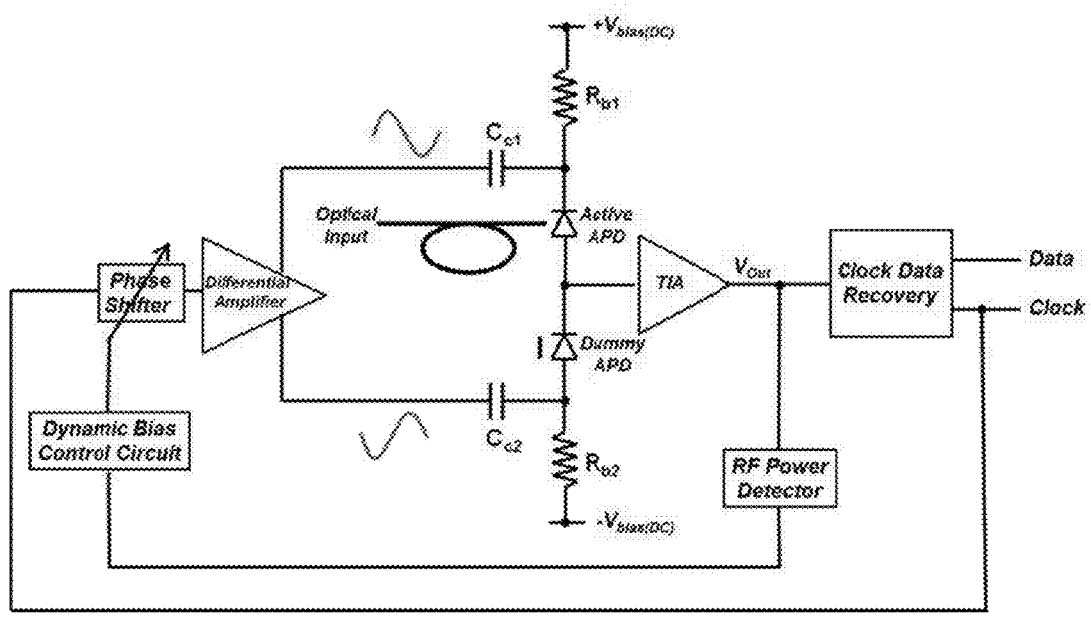
FIG. 3A is a schematic diagram of an embodiment of controlled dynamic bias cancellation circuitry.
Figure 3B:
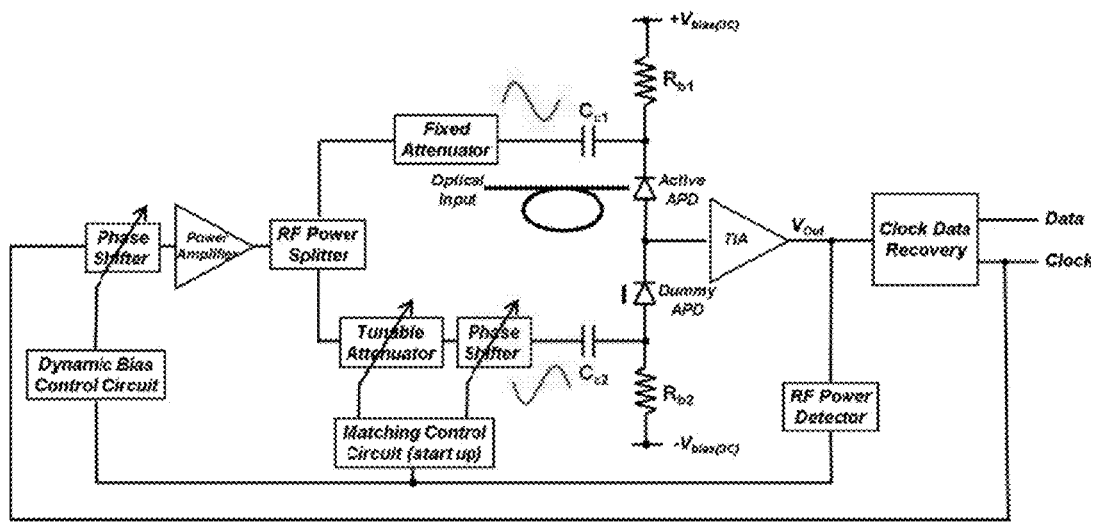
FIG. 3B is a schematic of a more advanced implementation of controlled dynamic bias cancellation circuitry.

In one embodiment of the present invention, shown in FIG. 3A, the differential biasing technique is used to eliminate the current injection of dynamic bias. The differential amplifier splits the signal, preferably canceling out the AC dynamic bias. The phase of the dynamic bias signal is tuned automatically by the feedback signal generated through the RF output power detector. In a more complicated embodiment, shown in FIG. 3B, additional feedback is provided to eliminate any possible mismatch in the phase and/or amplitude of the differential dynamic bias signals generated by the differential amplifier. In this embodiment, the RF output power detector is preferably used to control the clock phase that feeds into the dynamic bias. The fixed attenuator is preferably used to compensate the insertion loss, which is introduced by the tunable attenuator and the phase shifter on the other branch of the splitter. The same signal from the RF power detector can be used to tune the phase and amplitude of the injected dynamic bias to null the injected noise. This ensures that the two split signals are substantially 180 degrees out of phase and have identical amplitudes, thereby canceling out the AC dynamic bias. This feedback does not have to be in effect on a continuous basis (although it can be); it is preferably used at start-up and periodically thereafter.

In either embodiment, a dummy APD, which is matched in capacitance as closely as possible to the primary APD, is preferably used to cancel the injected AC dynamic bias. Alternatively, a varactor can be used instead of the dummy APD. The varactor tuning voltage is preferably similar to that of the dummy APD, i.e. $-V_{Bias(DC)}$. A slight mismatch between the capacitance of the varactor and the APD can be compensated for by tuning the phase and amplitude of the dynamic bias coming from the RF power splitter. In an alternative embodiment, if the change in capacitance of the APD due to dynamic bias is small, a simple fixed capacitor is used instead of the dummy APD. Similarly, a slight mismatch between the capacitance and the APD can be compensated by tuning the phase and amplitude of the dynamic bias coming from the RF power splitter.

In some embodiments a notch filter can be used just before or after the TIA to remove the dynamic bias signal.

Other embodiments of the present invention include a low pass, high pass, or bandpass filter between the output of the differential amplifier output $V_{out}$ and the RF power detector. The filter preferably performs temporal averaging of the output to remove high-frequency noise, and/or eliminates and/or averages out or removes certain periodic components that may not be relevant to the phase mismatch and the correction thereof, and/or accentuates the role of certain output components that are most relevant to the mismatch and its correction. See M. M. Hayat, P. Zarkesh-Ha, G.

El-Howayek, R. Efroymson, and J. C. Campbell, "Breaking the buildup-time limit of sensitivity in avalanche photodiodes by dynamic biasing," Optics Express, vol. 23, no. 18, pp. 24035-24041, 2015.

Dynamic Biasing of Linear-Mode APDs for NRZ Detection

Figure 4:
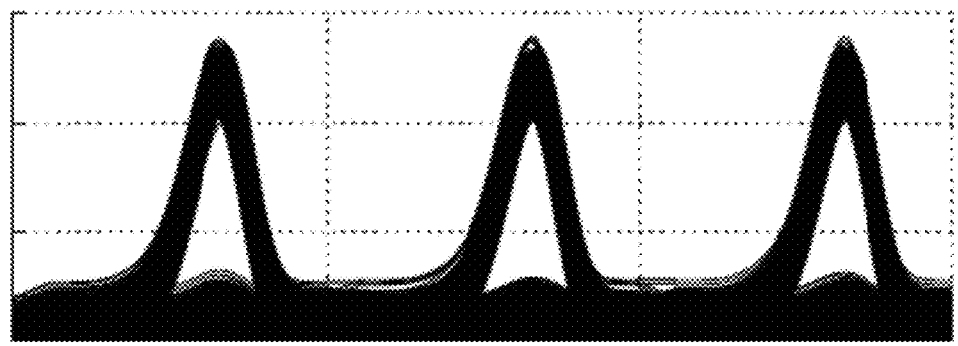
FIG. 4 is a calculated eye-diagram when dynamic biasing is used for an InP APD with a multiplication-region width of 200 nm.

FIG. 4 shows the calculated buildup-time limited eye-diagram when dynamic biasing is used for an InP APD having a multiplication-region width of 200 nm. The eye for conventional biasing is totally closed in this case (not shown). Since the instantaneous gain of the APD follows the dynamic bias within each bit, the shape of the eye is different from the conventional NRZ eye under static biasing. The physics of the buildup-time reduction can be explained as follows. The photocurrent generated an optical pulse under such dynamic biasing has the following two properties. First, photons that arrive early in the optical pulse experience a period of high electric field in the multiplication region of the APD, where they can generate a strong avalanche current in the early phase of the optical-pulse interval. As a low electric field period follows within the same optical pulse, carriers in the multiplication region undergo a much weakened impact ionization process, which leads to the termination of the avalanche pulse with a high probability. Second, photons that arrive late in the optical pulse period are still detected as the APD remains reverse biased throughout the bias period. However, the resulting avalanche gain is very low and the avalanche pulses they trigger are very short. Overall a high gain is generated over the optical bit but with minimal ISI.

A sinusoidal-gating approach has been proposed for Geiger-mode APDs in the context of gated photon-counting; however, its rationale is different from the linear-mode dynamic biasing presented here. The purpose of sinusoidal-gating Geiger-mode operation is to force quenching of the avalanche pulse after each detection-gate (high cycle of the sinusoidal bias) to minimize the total number of multiplications, which, in turn, would reduce after-pulsing.

Experimental Results

Figure 5:
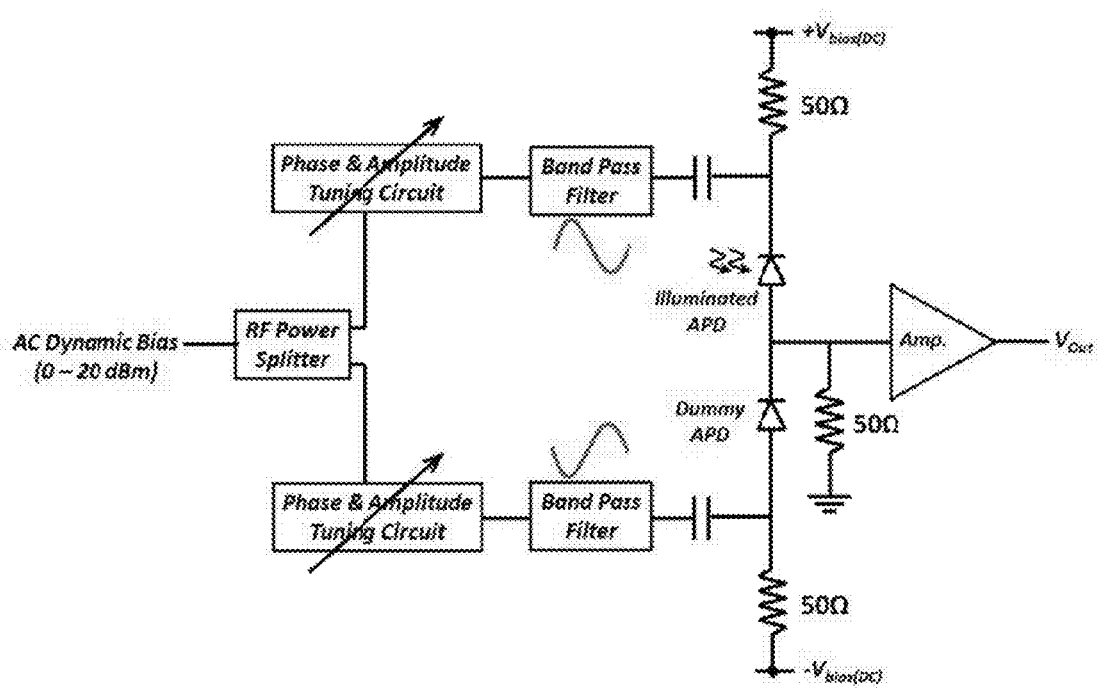
FIG. 5 is an embodiment of a custom designed differentially balanced circuit for dynamically biased APD.

An optical receiver with dynamic biasing was designed and implemented using commercially available components and employing a germanium APD (where $\beta/\alpha$ is slightly larger than unity), as shown in the block diagram of FIG. 5. The APD used is a model GAV40, fabricated by GDP Optoelectronic Corp., with a breakdown voltage of about 29 V and a 3 dB cut-off frequency of 1.5-2 GHz at low gains. To eliminate the dynamic-bias signal injection to the APD output, a matching dummy APD (bottom) was used in a fully differential configuration. A pattern generator was used to drive a Mach-Zehnder modulator, in conjunction with a 1.55 µm DFB laser source, producing a pseudo-random optical bit stream (PRBS=$2^{31}$-1) at a data rate of 3 Gbps. The optical signal was fed into the upper APD through an optical delay line that precisely controls the delay between the optical bit stream and the AC bias signal. The APD output was buffered with an RF amplifier and fed into a bit-error-rate analyzer for error rate testing. The sinusoidal AC bias signal was generated using a sweep oscillator (HP 8350B) that was synchronized with the bit sequence from the pattern generator. Two phase- and amplitude-tuning circuits were used to reverse the polarity of the dummy APD and to ensure that the sinusoidal outputs from the two APDs, resulting from the AC bias signals, were precisely matched and therefore cancelled at the 50Ω load resistor. The purpose of the bandpass filters is to eliminate any high-order harmonics generated by the amplitude- and phase-tuning circuits. Finally, the RF amplifier amplifies the sinusoid-free signal generated by the photocurrent through the 50Ω load resistor. The 50Ω resistor and RF amplifier would be replaced in a practical receiver by a trans-impedance amplifier (TIA), which may further boost the overall optical-receiver sensitivity due to an improved signal-to-noise ratio.

FIGS. 6A-6B show a comparison of the eye diagrams when an AC bias of 0.9 Vpp is applied (FIG. 6B) and when no AC biasing is applied (FIG. 6A). The optical input in both cases was −17.6 dBm, and the data rate was 3 Gbps. The DC bias was selected to maximize the eye opening in the static biasing case. For the dynamic biasing case, the AC bias was superimposed on the same DC bias, and the optical delay line was tuned to maximize the eye opening. The dramatic widening in the eye is clearly evident as a result of the application of the delay-optimized AC bias. FIG. 7A shows the bit error rate (BER), at a data rate of 3 Gbps, as a function of the applied DC bias in the absence of AC bias; the BER was $2 \times 10^{-6}$ at a reverse bias DC voltage of −26.4 V. The dashed line shows the BER when a 0.9 Vpp AC signal is applied and the delay is optimized. The results demonstrate a significant improvement in the BER by a factor of 3,500 (when input optical power is −20 dBm). FIG. 7B shows the BER as a function of the optical power seen by the APD for both cases, when the AC bias is applied and when the AC bias is absent. The results show that the receiver sensitivity (when BER=$10^{-9}$) at 3 Gbps transmission is improved by 4.3 dB.

In summary, a demonstration of improvement of high speed direct-detection communications by using dynamically biased APDs was performed. Compared with static biasing, a 4.3 dB improvement in receiver sensitivity and 3,500 fold bit-error-rate reduction at 3 Gbps was found using a germanium APD. An APD-type—agnostic approach for the linear-mode operation of APD-based receivers by employing bit-synchronous, ionization-engineered and periodic dynamic biasing was studied. Such dynamic biasing regulates the impact-ionization process, thereby limiting the buildup time to unprecedented low levels, regardless of the structure and material composition of the APD. These experiments confirm theoretical predictions of approximately 4-5 fold elevation in the build-up-time limited bandwidth. Thus the dynamic-biasing approach should ultimately enable existing commercially available 10 Gbps InP APDs to operate at 40 Gbps receivers (once proper high-speed design and packaging is employed) with little or no penalty on sensitivity. Bit-synchronous dynamic biasing of an APD was shown to significantly benefit the optical receiver speed and sensitivity in non-return to zero (NRZ) signaling by reducing the avalanche buildup time and thereby minimizing the ISI.

Although the invention has been described in detail with particular reference to the disclosed embodiments, other embodiments can achieve the same results. Variations and modifications of the present invention will be obvious to those skilled in the art and it is intended to cover all such modifications and equivalents. The entire disclosures of all patents, references, and publications cited above are hereby incorporated by reference.

What is claimed is:

1. A method of maximizing the output signal of a dynamically biased avalanche photodiode (APD), the method comprising:
   dynamically biasing an APD;
   amplifying an output of the APD;
   measuring the amplified output; and
   automatically varying a phase of the AC signal used to dynamically bias the APD until a maximum of the amplified output is achieved.

2. The method of claim 1 wherein the amplifying step comprises using a transimpedance amplifier.

3. The method of claim 1 wherein the measuring step comprises measuring a radio frequency (RF) power of the amplified output.

4. The method of claim 1 wherein the varying step is performed substantially slower than a clock speed of the output signal.

5. The method of claim 1 further comprising:
splitting the AC signal into two split AC signals which are 180° out of phase with each other; and
canceling out the AC signal, thereby removing it from the output of the APD.

6. The method of claim 5 wherein the splitting step is performed using a differential amplifier.

7. The method of claim 5 wherein in the splitting step is performed using an RF power splitter.

8. The method of claim 5 wherein the canceling step is performed using a dummy APD, varactor, or fixed capacitor matched to the capacitance of the APD.

9. The method of claim 1 further comprising filtering the amplified output to perform a function selected from the group consisting of performing temporal averaging of the output to remove high-frequency noise, eliminating, averaging out, and/or removing periodic components of the amplified output, and accentuating the correction of output components that affect phase mismatch of the two split AC signals.

10. The method of claim 9 wherein the filtering step is performed prior to the measuring step.

11. The method of claim 1 performed to correct for phase drift over time, temperature changes, and/or device aging effects.

12. An apparatus for maximizing the output signal of a dynamically biased avalanche photodiode (APD), the apparatus comprising:
a dynamically biased APD;
an amplifier for amplifying the output of the APD;
an RF power detector connected to the output of the amplifier; and
a phase shifter for adjusting the phase of an AC signal used to dynamically bias the APD until an output of the RF power detector is maximized.

13. The apparatus of claim 12 further comprising a differential amplifier having an input connected to the output of the phase shifter and two outputs 180° out of phase with each other, wherein the first output biases the APD and the second output biases a dummy APD, varactor, or fixed capacitor.

14. The apparatus of claim 12 further comprising an RF power splitter having an input connected to the output of the phase shifter and two outputs 180° out of phase with each other, wherein the first output biases the APD and the second output biases a dummy APD, varactor, or fixed capacitor.

15. The apparatus of claim 14 wherein the first output biases the APD through a fixed attenuator, and the second output biases the dummy APD, varactor, or fixed capacitor through a tunable attenuator and a second phase shifter.

16. The apparatus of claim 15 wherein the tunable attenuator and second phase shifter use the output of the RF power detector as an input.

17. The apparatus of claim 12 wherein the amplifier is a transimpedance amplifier.

18. The apparatus of claim 12 further comprising a filter disposed between the amplifier and the RF power detector.

19. The apparatus of claim 18 wherein the filter comprises a low pass filter, a high pass filter, or a bandpass filter.

* * * * *